(12) United States Patent
Gu et al.

(10) Patent No.: US 10,287,493 B2
(45) Date of Patent: *May 14, 2019

(54) COMPOSITE FILM AND FABRICATION METHOD THEREOF, PHOTOELECTRIC ELEMENT AND PHOTOELECTRIC APPARATUS

(71) Applicant: BOE TECHNOLOGY GROUP CO., LTD., Beijing (CN)

(72) Inventors: Jingxia Gu, Beijing (CN); Chen Tang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/787,207

(22) Filed: Oct. 18, 2017

(65) Prior Publication Data

US 2018/0037814 A1 Feb. 8, 2018

Related U.S. Application Data

(62) Division of application No. 14/426,811, filed as application No. PCT/CN2014/083081 on Jul. 25, 2014, now Pat. No. 9,828,544.

(30) Foreign Application Priority Data

Oct. 21, 2013 (CN) .......................... 2013 1 0495376

(51) Int. Cl.
*C09K 11/56* (2006.01)
*C09K 11/06* (2006.01)
(Continued)

(52) U.S. Cl.
CPC ............ *C09K 11/565* (2013.01); *B05D 1/005* (2013.01); *C08G 61/02* (2013.01); *C08K 3/30* (2013.01);
(Continued)

(58) Field of Classification Search
CPC ....... C09K 11/06; C09K 11/08; C09K 11/881; C09K 11/565; C09K 2211/14;
(Continued)

(56) References Cited

U.S. PATENT DOCUMENTS 5,998,045 A 12/1999 Chen et al.
7,843,128 B2 11/2010 Ookawa et al.
(Continued)

FOREIGN PATENT DOCUMENTS

CN 1595670 A 3/2005
CN 1743361 A 3/2006
(Continued)

OTHER PUBLICATIONS

International Search Report and Written Opinion of the International Searching Authority with Notice of Transmittal of the International Search Report and Written Opinion of PCT/CN2014/083081 in Chinese, dated Oct. 31, 2014.
(Continued)

*Primary Examiner* — Matthew E. Hoban
*Assistant Examiner* — Lynne Edmondson
(74) *Attorney, Agent, or Firm* — Collard & Roe, P.C.

(57) ABSTRACT

Embodiments of the invention relate to a composite film and a fabrication method thereof, a photoelectric element and a photoelectric apparatus. The fabrication method of the composite film includes: preparing a polyfluorene-based compound solution, wherein the polyfluorene-based compound solution includes polyfluorene or polyfluorene derivatives; preparing a quantum dot solution; mixing the polyfluorene-based compound solution and the quantum dot solution together to prepare a mixed solution; removing a solvent in the mixed solution to prepare the composite film.

8 Claims, 1 Drawing Sheet

(51) Int. Cl.
*H01L 51/50* (2006.01)
*H01L 33/06* (2010.01)
*B05D 1/00* (2006.01)
*C08G 61/02* (2006.01)
*H01L 51/00* (2006.01)
*C08K 3/30* (2006.01)

(52) U.S. Cl.
CPC ............ *C09K 11/06* (2013.01); *H01L 33/06* (2013.01); *H01L 51/0003* (2013.01); *C08G 2261/1412* (2013.01); *C08G 2261/3142* (2013.01); *C08G 2261/5222* (2013.01); *C08G 2261/95* (2013.01); *C08K 2003/3036* (2013.01); *C09K 2211/1416* (2013.01); *H01L 51/0039* (2013.01); *H01L 51/502* (2013.01)

(58) Field of Classification Search
CPC ... H01L 51/0039; H01L 51/502; H01L 51/56; H01L 51/0003; H01L 51/0007; H01L 51/0043; H01L 51/0004; C08G 2261/3142; C08G 2261/5222; C08G 2261/95; Y02B 20/181
USPC .................................................... 252/301.33
See application file for complete search history.

(56) References Cited

U.S. PATENT DOCUMENTS

| | | | |
|---|---|---|---|
| 9,716,230 B2 * | 7/2017 | Tang | ............ H01L 51/502 |
| 9,828,544 B2 | 11/2017 | Gu et al. | |
| 9,905,789 B2 * | 2/2018 | Gu | ............ H01L 51/502 |
| 9,941,482 B2 * | 4/2018 | He | ............ H01L 51/5092 |
| 2005/0001538 A1 | 1/2005 | Ozkan et al. | |
| 2005/0002635 A1 | 1/2005 | Banin et al. | |
| 2005/0142380 A1 | 6/2005 | Chin et al. | |
| 2005/0236981 A1 | 10/2005 | Cok et al. | |
| 2006/0046092 A1 | 3/2006 | Towns et al. | |
| 2006/0231844 A1 | 10/2006 | Carter | |
| 2008/0007162 A1 | 1/2008 | Ookawa et al. | |
| 2008/0238299 A1 | 10/2008 | Cho et al. | |
| 2008/0278063 A1 | 11/2008 | Cok | |
| 2008/0280162 A1 | 11/2008 | Morii | |
| 2009/0008628 A1 | 1/2009 | Choi et al. | |
| 2009/0308456 A1 | 12/2009 | Rand et al. | |
| 2009/0314991 A1 | 12/2009 | Cho et al. | |
| 2010/0064306 A1 | 3/2010 | Tiongson et al. | |
| 2010/0090195 A1 | 4/2010 | Parsapour | |
| 2010/0117110 A1 | 5/2010 | Park et al. | |
| 2010/0177496 A1 | 7/2010 | Gillies et al. | |
| 2010/0190281 A1 | 7/2010 | Ishida et al. | |
| 2010/0200869 A1 | 8/2010 | Sekiya | |
| 2010/0213437 A1 | 8/2010 | Akai et al. | |
| 2010/0213438 A1 | 8/2010 | Cho et al. | |
| 2010/0237322 A1 | 9/2010 | Okada et al. | |
| 2011/0023932 A1 | 2/2011 | Fukui et al. | |
| 2011/0291071 A1 | 12/2011 | Kim et al. | |
| 2012/0018716 A1 * | 1/2012 | Zhao | ............ C08F 20/18 257/40 |
| 2012/0068121 A1 | 3/2012 | Sparrowe et al. | |
| 2012/0175588 A1 | 7/2012 | Qiao et al. | |
| 2012/0267616 A1 | 10/2012 | Jang et al. | |
| 2013/0146838 A1 | 6/2013 | Ku et al. | |
| 2013/0200348 A1 | 8/2013 | Pillow et al. | |
| 2013/0203198 A1 | 8/2013 | Min et al. | |
| 2014/0014896 A1 | 1/2014 | Chung et al. | |
| 2014/0302627 A1 | 10/2014 | Ko et al. | |
| 2014/0306179 A1 | 10/2014 | Demir et al. | |
| 2015/0021551 A1 | 1/2015 | Breen et al. | |
| 2015/0076469 A1 | 3/2015 | Ikemizu et al. | |
| 2015/0083991 A1 | 3/2015 | Tang et al. | |
| 2015/0107674 A1 | 4/2015 | Lee et al. | |
| 2015/0228697 A1 | 8/2015 | Liu et al. | |
| 2015/0295035 A1 | 10/2015 | Ono et al. | |
| 2015/0325803 A1 | 11/2015 | Lee et al. | |
| 2015/0329774 A1 | 11/2015 | Gu et al. | |
| 2015/0380654 A1 | 12/2015 | Tang et al. | |
| 2016/0005989 A1 | 1/2016 | Gu et al. | |
| 2016/0301011 A1 | 10/2016 | Nakaie et al. | |
| 2016/0301024 A1 | 10/2016 | He et al. | |
| 2016/0365534 A1 | 12/2016 | Gao et al. | |

FOREIGN PATENT DOCUMENTS

| | | |
|---|---|---|
| CN | 1772837 A | 5/2006 |
| CN | 101197428 A | 6/2008 |
| CN | 101219921 A | 7/2008 |
| CN | 101255336 A | 9/2008 |
| CN | 101307865 A | 11/2008 |
| CN | 101314665 A | 12/2008 |
| CN | 101328303 A | 12/2008 |
| CN | 101810056 A | 8/2010 |
| CN | 101937975 A | 1/2011 |
| CN | 102027384 A | 4/2011 |
| CN | 102295745 A | 12/2011 |
| CN | 102483220 A | 5/2012 |
| CN | 102723440 A | 10/2012 |
| CN | 103323975 A | 9/2013 |
| CN | 103421513 A | 12/2013 |
| CN | 103500803 A | 1/2014 |
| CN | 103525406 A | 1/2014 |
| CN | 103779509 A | 5/2014 |
| CN | 103904178 A | 7/2014 |
| KR | 2013-0039340 A | 4/2013 |
| WO | 2005/018011 A2 | 2/2005 |
| WO | 2009/140381 A1 | 11/2009 |
| WO | 2010/120900 A1 | 10/2010 |
| WO | 2012/047042 A2 | 4/2012 |
| WO | 2013/112298 A1 | 8/2013 |
| WO | 2013/157494 A1 | 10/2013 |

OTHER PUBLICATIONS

English translation of the International Search Report of PCT/CN2014/083081, dated Oct. 31, 2014.
English translation of the Written Opinion of the International Searching Authority of PCT/CN2014/083081, dated Oct. 31, 2014.
First Chinese Office Action of Chinese Application No. 201310495376.X, dated Jun. 30, 2014 with English translation.
Second Chinese Office Action of Chinese Application No. 201310495376.X, dated Feb. 3, 2015 with English translation.
The Notification to Grant the Patent Right (Notice of Allowance) for 201310495376.X dated Jul. 21, 2015 with English translation.
The Issued Patent for CN 103525406B (Application No. CN 201310495376.X) which was granted on Aug. 26, 2015 in Chinese with the Chinese granted claims with an English translation.
Wang et al., "Photoinduced Charge Transfer and Efficient Solar Energy Conversion in a Blend of a Red Polyfluorene copolymer with CdSe Nanoparticles", Jul. 19, 2006, Nano Letters, vol. 6, No. 8, pp. 1789-1793.
Guo et al., "CdSe/ZnS Nanoparticle Composites with Amine-Functionalized Polyfluorene Derivatives for Polymeric Light-Emitting Diodes: Synthesis, Photophysical Properties, and the Electroluminescent Performance", Feb. 1, 2010, Macromolecules, 43, pp. 1860-1866.
Chou et al., Hybrid White-Light Emitting-Led Based on Luminescent Polyfluorene Polymer and Quantum Dots, 2007, Journal of Nanoscience and Nanotechnology, vol. 7, pp. 2785-2789.
International Search Report of PCT/CN2014/080748 in Chinese, dated Sep. 3, 2014 with English translation.
Notice of Transmittal of the International Search Report of PCT/CN2014/080748 in Chinese, dated Sep. 3, 2014.
Written Opinion of the International Searching Authority of PCT/CN2014/080748 in Chinese, dated Sep. 3, 2014 with English translation.
English translation of the International Preliminary Report on Patentability and Written Opinion of the International Searching Authority of PCT/CN2014/080748, dated Apr. 26, 2016.
Tang, Chao et al., "Polyfluorenes and Its Derivatives for Electroluminescent Materials", Progress in Chemistry, No. 10, vol. 19, Oct. 31, 2007 (Oct. 31, 2007), ISSN: ISSN 1005-281X, pp. 1553-1561, with English abstract.

(56) References Cited

OTHER PUBLICATIONS

First Chinese Office Action in CN 201310495591.X, dated Oct. 10, 2014 with English translation.
Non-Final U.S. Office Action in U.S. Appl. No. 14/418,256 dated Mar. 8, 2016.
Second Chinese Office Action in CN 201310495591.X, dated Apr. 28, 2015 with English translation.
Final U.S. Office Action in U.S. Appl. No. 14/418,256 dated Aug. 8, 2016.
Non-Final U.S. Office Action in U.S. Appl. No. 14/418,256 dated Nov. 1, 2016.
Non-Final U.S. Office Action in U.S. Appl. No. 14/418,256 dated May 11, 2017.
International Search Report of PCT/CN2014/076133 in Chinese, dated Nov. 26, 2014 with English translation.
Notice of Transmittal of the International Search Report of PCT/CN2014/076133 in Chinese, dated Nov. 26, 2014.
Written Opinion of the International Searching Authority of PCT/CN2014/076133 in Chinese, dated Nov. 26, 2014 with English translation.
English translation of the International Preliminary Report on Patentability and Written Opinion of the International Searching Authority of PCT/CN2014/076133, dated Aug. 2, 2016.
First Chinese Office Action in CN 201410040018.4, dated Aug. 6, 2015 with English translation.
Second Chinese Office Action in CN 201410040018.4, dated Dec. 8, 2015 with English translation.
Non-Final U.S. Office Action in U.S. Appl. No. 14/436,949 dated Jan. 21, 2016.
"White emission from polymer/quantum dot ternary nanocomposites by incomplete energy transfer" by Jong Heyok Park et al., Nanotechnology 15 (2004) 1217-1220.
Non-Final U.S. Office Action in U.S. Appl. No. 14/436,949 dated Jul. 21, 2016.
Final U.S. Office Action in U.S. Appl. No. 14/436,949 dated Mar. 2, 2017.
"Three-Band White Light-Emitting Diodes Based on Hybridization of Polyfluorene and Colloidal CdSe—ZnS Quantum Dots" in IEEE Photon ICS Technology Letters, vol. 22, No. 5, March 1, 2010 by Chun-Yuan Huang et al.
"Hybrid White-Light Emitting-LED Based on Luminescent Polyfluorene Polymer and Quantum Dots" in Journal of Nanoscience and Nanotechnology, vol. 7, 2785-2789, 2007, by Cheng-Hsuan Chou et al.
"Efficient hybrid white light-emitting diodes by organic-inorganic materials at different CCT from 3000K to 9000K" in Optics Express, vol. 23, Issue 7, p. A204 by Kuo-Ju Chen et al., 2015.
"Highly Efficient White Light-Emitting Diodes Based on Quantum Dots and Polymer Interface" in IEEE Photonics Technology Letters, vol. 24, No. 18, Sep. 15, 2012, by Byoung-Ho Kang et al.
"Excellent Color Quality of White-Light-Emitting Diodes by Embedding Quantum Dots in Polymers Material" IEEE Journal of Selected Topics in Quantum Electronics, Vol. 22, No. 1, Jan./Feb. 2016 by Huang-Yu Lin et al.
Notice of Allowance in U.S. Appl. No. 14/436,949 dated May 18, 2017.
"CdSe/ZnS Nanoparticle Composites with Amine-Functionalized Polyfluorene Derivatives for Polymeric Light-Emitting Diodes: Synthesis, Photophysical Properties, and the Electroluminescent Performance" by Zeng-Shan Guo et al. in Macromolecules 2010, 43, 1860-1866.
International Search Report of PCT/CN2015/070611 in Chinese, dated Jun. 10, 2015 with English translation.
Notice of Transmittal of the International Search Report of PCT/CN2015/070611 in Chinese, dated Jun. 10, 2015.
Written Opinion of the International Searching Authority of PCT/CN2015/070611 in Chinese, dated Jun. 10, 2015 with English translation.
English translation of the International Preliminary Report on Patentability and Written Opinion of the International Searching Authority of PCT/CN2015/070611, dated Mar. 28, 2017.
First Chinese Office Action in CN 201410498485.1, dated Mar. 30, 2016 with English translation.

\* cited by examiner

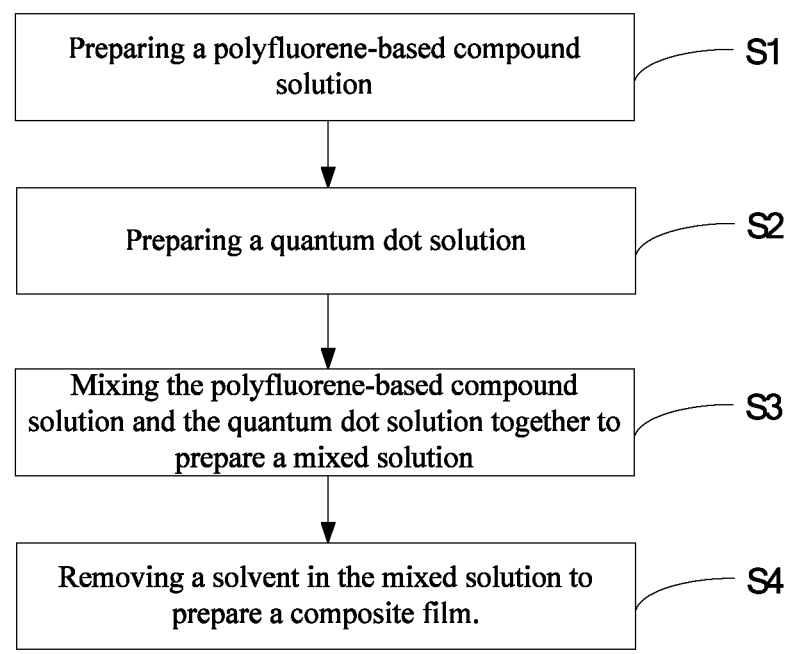

COMPOSITE FILM AND FABRICATION METHOD THEREOF, PHOTOELECTRIC ELEMENT AND PHOTOELECTRIC APPARATUS

CROSS REFERENCE TO RELATED APPLICATIONS

This application is a divisional of and Applicants claim priority under 35 U.S.C. §§ 120 and 121 of U.S. application Ser. No. 14/426,811 filed on Mar. 9, 2015, which application is a national stage application under 35 U.S.C. § 371 of PCT Application No. PCT/CN2014/083081 filed Jul. 25, 2014 which claims priority under 35 U.S.C. § 119 from Chinese Patent Application No. 201310495376.X filed Oct. 13, 2013, the disclosures of each of which are hereby incorporated by reference. A certified copy of priority Chinese Patent Application No. 201310495376.X is contained in parent U.S. application Ser. No. 14/426,811. The International Application under PCT article 21(2) was not published in English.

TECHNICAL FIELD

Embodiments of the invention relate to a composite film and a fabrication method thereof, a photoelectric element and a photoelectric apparatus.

BACKGROUND

Currently, application of a composite film in display and illumination will be a new direction for future display and illumination technologies. It is well known that white light is obtained by a combination of colors such as red, green, blue and yellow, and typically, respective colors are achieved by their respective corresponding light-emitting materials, which can achieve white light by co-doping.

In recent years, a new type of semiconductor nano-material—quantum dots—emerges, which is also known as a semiconductor nano-crystal, with a size between 1-10 nm. Due to a quantum size effect and a dielectric confinement effect, the quantum dots have unique photo-luminescent and electroluminescent properties. As compared with conventional organic fluorescent dyes, the quantum dots have superior optical characteristics such as high quantum efficiency, high photochemical stability, not prone to photolysis, and broad excitation, narrow emission, high color purity, and having luminous colors adjustable by controlling the size of the quantum dots. Thus, white light is often achieved by using the quantum dots in the prior art. There is a film emitting white light, which is obtained by mixing the quantum dots of a plurality of different colors; however, at the time of achieving white light, phenomena such as agglomeration and fluorescence quenching are apt to occur between the quantum dots.

SUMMARY OF THE INVENTION

According to an embodiment of the invention, there is provided a fabrication method of a composite film, comprising:

Preparing a polyfluorene-based compound solution, wherein the polyfluorene-based compound solution includes polyfluorene or polyfluorene derivatives;

Preparing a quantum dot solution, wherein the quantum dot solution includes quantum dots;

Mixing the polyfluorene-based compound solution and the quantum dot solution together to prepare a mixed solution; and Removing a solvent in the mixed solution to prepare the composite film.

In one example, the polyfluorene derivatives include one or more materials selected from the group consisting of poly (9,9-dialkyl fluorene), copolymer of bis-hexyl fluorene and anthracene, biphenyl with dendrite-containing side chains, tetra-alkyl-substituted indenofluorene polymer, aryl-substituted indenofluorene polymer, polyfluorene-bithiophene alternate copolymer, as well as, binary or ternary random copolymers of fluorene and thiophene, ethylene dioxythiophene, 4,7-dithiophene-2,1,3-benzothiadiazole, or 4,7-dithiophene-2,1,3-benzoselenadiazole.

In one example, the quantum dots include at least one of Group II-VI element compounds and Group III-V element compounds.

In one example, a concentration of the polyfluorene-based compound solution is 3 wt %-25 wt %; and a concentration of the quantum dot solution is 4 mg/ml-30 mg/ml; and In the mixed solution, the polyfluorene-based compound solution accounts for 50 wt %-90 wt %, and the quantum dot solution accounts for 10 wt %-50 wt %.

In one example, the solvent in the polyfluorene-based compound solution is methylbenzene, chlorobenzene or chloroform, and the solvent in the quantum dot solution is methylbenzene, chlorobenzene or chloroform.

In one example, the solvent in the polyfluorene-based compound solution is methylbenzene, and the solvent in the quantum dot solution is methylbenzene.

In one example, the removing a solvent in the mixed solution to prepare the composite film, includes:

Removing the solvent to prepare the composite film, after preparing the mixed solution into a film by a method of spin coating, inkjet printing or printing.

According to another embodiment of the invention, there is provided a composite film, fabricated by using the above-described fabrication method.

In one example, in the composite film, a range of mass ratio of the polyfluorene-based compounds to the quantum dots is 400:1-5:1, wherein the polyfluorene-based compounds include polyfluorene or polyfluorene derivatives.

According to a further embodiment of the invention, there is provided a photoelectric element, including the above-described composite film.

According to still a further embodiment of the invention, there is provided a photoelectric apparatus, including the above-described photoelectric element.

In the above-described technical solutions provided by the embodiments of the invention, polyfluorene emitting blue light and its derivatives are used as a matrix, compounded with the quantum dots emitting red light to form a film, with polyfluorene or polyfluorene derivatives as a short-wavelength portion in a white spectrum, and with the quantum dots as a long-wavelength portion, to achieve white light by light compensation. The film emitting white light is obtained only on a physical color complementarity principle; a desired color gamut value can be obtained by controlling a ratio of a fluorescent polymer (polyfluorene or polyfluorene derivatives) to the quantum dots, which can also avoid the phenomena of agglomeration and fluorescence quenching that occur when white light is achieved currently by using a quantum dot mixing method; in addition, there is a wide range for selecting and applying the materials of polyfluorene or polyfluorene derivatives and the quantum dots. The composite film fabricated by using the fabrication method provided by the invention has a good uniformity, and different polymer materials can be selected according to the spectrum of the quantum dots, which renders a wide applicability.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a flow schematic diagram of a fabrication method of a composite film provided by an embodiment of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a fabrication method of a composite film, as shown in FIG. 1, the fabrication method including steps of:

S1: preparing a polyfluorene-based compound solution.

Optionally, a solvent of the polyfluorene-based compound solution includes methylbenzene, chlorobenzene or chloroform, for example, the solvent in the polyfluorene-based compound solution includes methylbenzene; a solute in the polyfluorene-based compound solution is polyfluorene or polyfluorene derivatives. A concentration of the polyfluorene-based compound solution is 3 wt %-25 wt %.

Optionally, the polyfluorene derivatives include one or more materials selected from the group consisting of poly (9,9-dialkyl fluorene) (P17), copolymer of bis-hexyl fluorene and anthracene (P18), biphenyl with dendrite-containing side chains (P19), tetra-alkyl-substituted indenofluorene polymer (P21a), aryl-substituted indenofluorene polymer (P21b), triphenylamine coupled with two ends of anthracene-alkylfluorene emitting blocks (P22a), oxdiazole coupled with two ends of anthracene-alkylfluorene emitting blocks (P22b), polyfluorene-bithiophene alternate copolymer (P23), octyl-disubstituted fluorene and benzothiadiazole alternate copolymer (P24), copolymer with a main chain coupled with iridium complex and phenylpyridine (P25); as well as, binary or ternary random copolymers of fluorene and thiophene (Th), ethylene dioxythiophene (EDT), 4,7-dithiophene-2,1,3-benzothiadiazole (DBT), or 4,7-dithiophene-2,1,3-benzoselenadiazole (BTSe).

Polyfluorene and its derivatives have a relatively large energy band gap, which are the materials emitting blue light, and which, due to a biphenyl unit within a rigid plane contained thereby, has a relatively high thermal stability and chemical stability, so that the composite film fabricated has a higher thermal stability and chemical stability, and polyfluorene and its derivatives have a relatively high fluorescence quantum efficiency (0.6-0.8) in a solid state, thus enabling the composite film to have a relatively high fluorescence efficiency, and to enhance a fluorescence strength.

S2: preparing a quantum dot solution.

Optionally, the solvent in the quantum dot solution includes methylbenzene, chlorobenzene or chloroform, for example, the solvent in the quantum dot solution includes methylbenzene, the solute in the quantum dot solution is the quantum dots, and a concentration of the quantum dot solution is 4 mg/ml-30 mg/ml.

The quantum dots in the embodiment of the invention are nanoparticles consisting of at least one of Group II-VI element compounds and Group III-V element compounds. Therein, the nano-particles consisting of Group II-VI element compounds are compound semiconductor materials made of Group II elements Zn, Cd and Hg and Group VI elements S, Se and Te, an expression of Group II-VI element compounds being A(II)B(VI), i.e., ZnS, ZnSe, ZnTe, CdS, CdSe, CdTe, HgS, HgSe and HgTe; the nano-particles consisting of Group III-V element compounds are compound semiconductor materials made of Group III elements B, Al, Ga and In, and Group V elements N, P, As and Sb, and an expression of Group III-V element compounds being A(III)B(V), for example, BN, BP, BAs, BSb, AlN, AlP, AlAs, AlSb, GaN, GaP, GaAs, GaSb, InAs, InN, InP and InSb.

For example, a light-emitting wavelength of the quantum dots may be controlled by controlling sizes and materials thereof. For example, the quantum dots may be controlled to emit red light or green light.

For example, a concentration of the polyfluorene-based compound solution is 5 wt %-15 wt %. A concentration of the quantum dot solution is 5 mg/ml-15 mg/ml.

It should be noted that, a sequence between step S1 of preparing the polyfluorene-based compound solution and step S2 of preparing the quantum dot solution as described above is not limited. For example, step S1 may be performed before step S2, or step S1 may be performed after step S2, or step S1 and step S2 are performed simultaneously.

S3: mixing the polyfluorene-based compound solution and the quantum dot solution together, to prepare a mixed solution.

The polyfluorene-based compound solution prepared in step S1 and the quantum dot solution prepared in step S2 are mixed together in a specific ratio.

Optionally, in a case that a concentration of the polyfluorene-based compound solution is 3 wt %-25 wt %, and a concentration of the quantum dot solution is 4 mg/ml-30 mg/ml, the specific ratio is the polyfluorene-based compound solution:the quantum dot solution=9:1-1:1 (mass ratio). That is, in the mixed solution, the polyfluorene-based compound solution accounts for 50 wt %-90 wt %, and the quantum dot solution accounts for 10 wt %-50 wt %.

S4: removing the solvent in the mixed solution, to prepare the composite film.

After the mixed solution is prepared in step S3, the solvent may be removed to prepare the composite film, after the mixed solution is prepared into a film by the method of spin coating, inkjet printing or printing.

The preparation of the composite film by the method of spin coating includes steps of: dropping the mixed solution onto a substrate, driving the substrate to rotate at a specific rotational speed by a spin coater so that the mixed solution is uniformly spread into a film, and finally removing the solvent (i.e., methylbenzene, chlorobenzene or chloroform) by means of vacuum evaporation or high temperature evaporation, to form the composite film.

The preparation of the composite film by the method of ink-jet printing or printing includes steps of: printing the mixed solution onto the substrate by an inkjet printer or a printer, and then removing the solvent (i.e., methylbenzene, chlorobenzene or chloroform) by means of vacuum evaporation or high temperature evaporation, to form the composite film.

Exemplarily, the polyfluorene-based compound solution (with a concentration of 12 wt %) with a emission spectrum at 450 nm and a ZnS quantum dot solution with an emission peak at 620 nm are mixed in a ratio of 3:1 (mass ratio), which, by using the method of spin coating, is spin coated for 30 s at a rotational speed of 3,000 rpm, and then heated to remove the solvent, so as to prepare the composite film.

After the composite film has been fabricated in step S4, the composite film can be illuminated by a blue LED light, and the composite film can emit white light; of course, the composite film can also be powered to emit white light.

The fabrication method of the invention is simple, in which the polyfluorene emitting blue light and its derivatives are used as a matrix, compounded with the quantum dots emitting red light to form a film, with polyfluorene or polyfluorene derivatives as a short-wavelength portion and with the quantum dots as a long-wavelength portion in a white spectrum, to achieve white light by light compensation. The film emitting white light is obtained only on a physical color complementarity principle; and there is a wide range for selecting and applying the materials of polyfluorene and polyfluorene derivatives and the quantum dots.

The fabrication method of the invention is simple, the desired color gamut value can be obtained by controlling the ratio of the fluorescent polymer (polyfluorene or polyfluorene derivatives) to the quantum dots, which can also avoid the phenomena of agglomeration and fluorescence quenching that occur when white light is achieved currently by using a quantum dot mixing method; in addition, the composite film fabricated by the fabrication method provided by the invention has a good uniformity, and different polyfluorene or polyfluorene derivatives can be selected according to the spectrum of the quantum dots, exemplarily, for the quantum dots CdSe, if different polyfluorene or polyfluorene derivatives are selected, then the composite film fabricated, after illuminated by blue light or powered, can emit white light of different color gamut, and is applicable to different environments.

An embodiment of the invention further provides a composite film, which is fabricated by using the above-described fabrication method, the composite film comprising: polyfluorene or polyfluorene derivatives, as well as quantum dots, wherein a range of mass ratio of the polyfluorene or polyfluorene derivatives to the quantum dots covers 400:1-5:1.

For example, a range of mass ratio of the polyfluorene or polyfluorene derivatives to the quantum dots is 120:1-10:1.

An embodiment of the invention further provides a photoelectric element including the above-described composite film, and the photoelectric element may be: a photoelectric conversion device, a color filter, a backlight, a polarizer, a light emitting layer and the like.

An embodiment of the invention further provides a photoelectric apparatus, which includes the above-described composite film, and which may be: an illumination device, a liquid crystal display panel, an e-paper, an organic electroluminescence display (OLED), a mobile phone, a tablet personal computer, a television, a monitor, a laptop, a digital photo frame, a navigator, and any other product or component having an illumination or a display function.

Optionally, the composite film may be powered to emit light, so the composite film can be used for fabricating the photoelectric conversion device, to perform photoelectric conversion.

Optionally, the composite film may be applied to the product or component having an illumination function, exemplarily, the composite film may be powered or illuminated by blue light to emit white light, for use in an illuminating apparatus.

Alternatively, the composite film may be made into a light emitting layer, for use in an organic electroluminescent device. Exemplarily, a light emitting layer in the organic electroluminescent device is the composite film, and after powered, the organic electroluminescent device emits white light.

Alternatively, the composite film may be powered or illuminated by blue light to emit white light, and may be applied as the backlight for use in the liquid crystal display panel, and any other product or component having a display function.

The foregoing embodiments merely are exemplary embodiments of the invention, and not intended to define the scope of the invention, and the scope of the invention is determined by the appended claims.

What is claimed is:
1. A composite film which consists of:
a polyfluorene or a polyfluorene derivative; and
quantum dots;
wherein the polyfluorene derivative includes one or more materials selected from the group consisting of poly (9,9-dialkyl fluorene), copolymer of bis-hexyl fluorene and anthracene, biphenyl with dendrite-containing side chains, tetra-alkyl-substituted indenofluorene polymer, aryl-substituted indenofluorene polymer, polyfluorene-bithiophene alternate copolymer, as well as, binary or ternary random copolymers of fluorene and thiophene, ethylene dioxythiophene, 4,7-dithiophene-2,1,3-benzothiadiazole, or 4,7-dithiophene-2,1,3-benzoselenadiazole.

2. The composite film according to claim 1, wherein, in the composite film, a range of mass ratio of the polyfluorene or the polyfluorene derivative to the quantum dots is 400:1-5:1.

3. The composite film according to claim 1, wherein the quantum dots include at least one of Group II-VI element compounds and Group III-V element compounds.

4. The composite film according to claim 3, wherein a material of the quantum dots is at least one selected from the group consisting of ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, InAs, InN, InP and InSb.

5. A photoelectric element, comprising the composite film according to claim 1.

6. The photoelectric element according to claim 5, wherein, in the composite film, a range of mass ratio of the polyfluorene or the polyfluorene derivative to the quantum dots is 400:1-5:1.

7. The photoelectric element according to claim 5, wherein the quantum dots include at least one of Group II-VI element compounds and Group III-V element compounds.

8. The photoelectric element according to claim 7, wherein a material of the quantum dots is at least one selected from the group consisting of ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, InAs, InN, InP and InSb.

* * * * *